(12) United States Patent
Wernersson et al.

(10) Patent No.: US 8,063,450 B2
(45) Date of Patent: Nov. 22, 2011

(54) ASSEMBLY OF NANOSCALED FIELD EFFECT TRANSISTORS

(75) Inventors: Lars-Erik Wernersson, Lund (SE); Erik Lind, Malmö (SE); Tomas Bryllert, Göteborg (SE); Jonas Ohlsson, Malmö (SE); Truls Löwgren, Malmö (SE); Lars Samuelson, Malmö (SE); Claes Thelander, Lund (SE)

(73) Assignee: QuNano AB, Lund (SE)

( * ) Notice: Subject to any disclaimer, the term of this patent is extended or adjusted under 35 U.S.C. 154(b) by 0 days.

(21) Appl. No.: 12/441,220

(22) PCT Filed: Sep. 19, 2007

(86) PCT No.: PCT/EP2007/059914
§ 371 (c)(1),
(2), (4) Date: Nov. 23, 2009

(87) PCT Pub. No.: WO2008/034850
PCT Pub. Date: Mar. 27, 2008

(65) Prior Publication Data
US 2010/0176459 A1 Jul. 15, 2010

(30) Foreign Application Priority Data

Sep. 19, 2006 (SE) .................................. 0601998
Aug. 17, 2007 (SE) .................................. 0701884

(51) Int. Cl.
*H01L 27/088* (2006.01)
(52) U.S. Cl. ........ 257/392; 257/213; 257/274; 257/328; 257/E21.461
(58) Field of Classification Search .................. 257/213, 257/274, 328, 348, 392, E21.461
See application file for complete search history.

(56) References Cited

U.S. PATENT DOCUMENTS

| 7,087,920 | B1 | 8/2006 | Kamins |
| 7,223,444 | B2 | 5/2007 | Deppert et al. |
| 7,335,908 | B2 | 2/2008 | Samuelson et al. |
| 7,354,850 | B2 | 4/2008 | Seifert et al. |
| 7,432,522 | B2 | 10/2008 | Samuelson et al. |
| 7,528,002 | B2 | 5/2009 | Samuelson et al. |
| 2003/0010244 | A1 | 1/2003 | Ettmueller |

(Continued)

FOREIGN PATENT DOCUMENTS

GB 2 231 720 A 11/1990
(Continued)

OTHER PUBLICATIONS

U.S. Appl. No. 11/922,242, filed Jun. 16, 2006, Wernersson et al.
(Continued)

*Primary Examiner* — Tan N Tran
(74) *Attorney, Agent, or Firm* — The Marbury Law Group, PLLC (57) ABSTRACT

The present invention relates to vertical nanowire transistors with a wrap-gated geometry. The threshold voltage of the vertical nanowire transistors is controlled by the diameter of the nanowire, the doping of the nanowire, the introduction of segments of heterostructures in the nanowire, the doping in shell-structures surrounding the nanowire, tailoring the work function of the gate stack, by strain engineering, by control of the dielectrica or the choice of nanowire material. Transistors with varying threshold voltages are provided on the same substrate, which enables the design of advanced circuits utilizing the shifts in the threshold voltages, similar to the directly coupled field logic.

20 Claims, 5 Drawing Sheets

U.S. PATENT DOCUMENTS

| | | | |
|---|---|---|---|
| 2004/0075464 | A1 | 4/2004 | Samuelson et al. |
| 2005/0011431 | A1 | 1/2005 | Samuelson et al. |
| 2005/0017171 | A1 | 1/2005 | Samuelson et al. |
| 2005/0224888 | A1 | 10/2005 | Graham et al. |
| 2006/0011971 | A1 | 1/2006 | Hara |
| 2006/0011972 | A1* | 1/2006 | Graham et al. ............ 257/324 |
| 2006/0057360 | A1 | 3/2006 | Samuelson et al. |
| 2006/0128088 | A1 | 6/2006 | Graham et al. |
| 2006/0269927 | A1* | 11/2006 | Lieber et al. ............ 435/6 |
| 2007/0206488 | A1 | 9/2007 | Thelander et al. |
| 2008/0105296 | A1 | 5/2008 | Samuelson et al. |
| 2008/0142784 | A1 | 6/2008 | Samuelson et al. |
| 2008/0142926 | A1 | 6/2008 | Seifert et al. |
| 2008/0149914 | A1 | 6/2008 | Samuelson et al. |
| 2008/0149944 | A1 | 6/2008 | Samuelson et al. |
| 2008/0188064 | A1 | 8/2008 | Samuelson et al. |
| 2009/0014711 | A1 | 1/2009 | Samuelson et al. |
| 2009/0253250 | A1 | 10/2009 | Samuelson et al. |

FOREIGN PATENT DOCUMENTS

| | | |
|---|---|---|
| WO | WO 2004/034467 A2 | 4/2004 |
| WO | WO 2005/064639 A2 | 7/2005 |

OTHER PUBLICATIONS

U.S. Appl. No. 11/922,243, filed Jun. 16, 2006, Wernersson et al.
U.S. Appl. No. 12/003,738, filed Dec. 31, 2007, Samuelson et al.
U.S. Appl. No. 12/003,741, filed Dec. 31, 2007, Samuelson et al.
U.S. Appl. No. 12/224,822, filed Mar. 7, 2007, Samuelson et al.
U.S. Appl. No. 12/308,249, filed Jan. 14, 2008, Seifert et al.
U.S. Appl. No. 12/441,223, filed Sep. 18, 2007, Ohlsson et al.
U.S. Appl. No. 12/450,372, filed Mar. 28, 2008, Wernersson
U.S. Appl. No. 12/450,373, filed Mar. 26, 2008, Samuelson et al.
U.S. Appl. No. 12/499,491, filed Jul. 2, 2009, Ohlsson et al.
U.S. Appl. No. 12/520,125, filed Dec. 22, 2007, Pedersen et al.
Bindal et al., "The impact of silicon nano-wire technology on the design of single-work-function CMOS transistors and circuits," Manotechnology, Sep. 14, 2006, 17(17):4340-4351.
Bryllert et al., "Vertical High-Mobility Wrap-Gated InAs Nanowire Transistor," IEEE Electron Device Letters, May 2006, 27(5):323-325.
Bryllert et al., "Vertical wrap-gated nanowire transistors," Nanotechnology, Jun. 14, 2006, 17(11):S227-S230.
Cha et al., "Fabrication and characterization of pre-aligned gallium nitride nanowire field-effect transistors," Nanotechnology, Mar. 14, 2006, 17(5):1264-1271.
Choi et al., "FinFET process refinements for improved mobility and gate work function engineering," International Electron Devices Meeting 2002k IEDM Technical Digest, San Francisco, CA, Dec. 8-11, 2002, 259-262.
Goldberger et al., "Silicon vertically integrated nanowire field effect transistors," Nano Letters, Mar. 30, 2006, 6(5):973-977.
Kasai et al., "Multipath-switching device utilizing a GaAs-based multiterminal nanowire junction with size-controlled dueal Schottky wrap gates," Applied Physics Letters, May 16, 2007, 90(20):203504-1 to 203504-3.
Lauhon et al., "Epitaxial core-shell and core-multishell nanowire heterostructures," Nature, Nov. 7, 2002, 420:57-61.
Lind et al., Improved subthreshold slope in an InAs nanowire heterostructure field-effect transistor, Nano Letters, Aug. 16, 2006, 6(9):1842-1846.
Marchi et al., "Investigating the performance limits of silicon-nanowire and carbon-nanotube PETs," Solid State Electronics, Jan. 2006, 50(1):78-85.
Mikkelson et al., "High-density GaAs integrated circuit manufacturing," IEEE Transactions on Semiconductor Manufacturing, Aug. 2003, 16(3):384-389.
Ng et al., "Single crystal nanowire vertical surround-gate field-effect transistor," Nano Letters, May 29, 2004, 4(7):1247-1252.
Schmidt et al., "Realization of a silicon nanowire vertical surround-gate field-effect transistor," Small, Jan. 2006, 2(1):85-88.
Wong et al., "Recent progress in devices and materials for CMOS technology," VLSI Technology, Systems, and Applications, 2003 International Symposium, Oct. 6-8, 2003, Piscataway, NJ, USA, IEEE, Oct. 6, 2003, 13-16.

* cited by examiner

ASSEMBLY OF NANOSCALED FIELD EFFECT TRANSISTORS

CROSS-REFERENCE TO RELATED APPLICATIONS

This application is a National Stage application of PCT/EP2007/059914, filed Sep. 19, 2007, which claims priority from Swedish applications SE 0601998-8, filed Sep. 19, 2006 and SE 0701884-9, filed Aug. 17, 2007.

TECHNICAL FIELD

The present invention relates to nanoscaled field effect transistors. In particular the invention relates to a device comprising an assembly of nanowire wrap-gated field effect transistors.

BACKGROUND

The transistor is the fundamental building block for electronic circuit design. Performance metrics, like speed, power consumption and the number of transistors used are directly related to the choice of transistor technology that is used for the implementation. The selected technology may hence strongly influence the circuit performance.

The main factors that define a field-effect transistor (FET) are the type of carriers used (n or p) and the threshold voltage. The type of carriers determines the response of an input voltage to the gate on the output current at the drain terminal. For a n-type device the on-current is increased as the gate voltage is increased, while for a p-type device the on-current is decreased as the gate voltage is increased. The type of conduction is set by the doping of the material. The threshold voltage determines the voltage level at which the transistor goes from the off-state to the on-state. In a planar technology the threshold voltage is given by the geometry of the device. Normally-on (or depletion mode) DFETs often have advantageous high-frequency performance as compared to normally-off (or enhancement mode) EFETs, since the channel in DFETs remains open on the source and drain side of the gate, which reduces the access resistance. EFETs often suffer from high access resistance as the external part of the channel remains partially depleted which adds resistance. It is hence well known in the field that it is difficult to design and fabricate good enhancement mode devices.

While circuits may be designed with one type of transistors only, it is often favorably to combine different types of transistors. For instance, in the complementary-metal-oxide-semiconductor technology (CMOS) n- and p-type metal-oxide-semiconductor field-effect transistors MOSFETs, are combined primarily to reduce the power consumption in logic elements. Notably, the CMOS does only consume negligible static power while the dynamic power consumption is dominating. The price to pay for this implementation is that the speed is set by the comparably slower PMOS transistors.

The main advantage of using semiconductors commonly referred to as III/V semiconductors is the carrier transport properties. n-type devices are typically considered mainly due to the substantially higher mobility for the electrons than for the holes. In III/V-design, where there is a lack of CMOS technology, design with DFETs only may be considered and has been demonstrated for instance in the unbuffered FET logic circuits and in Schottky diode FET logic circuits. These circuits, however, require level shifters for the switching between negative and positive biases and may even require two levels of signals in the circuit. This adds complexity to the circuit and increases the power consumption. Design with EFETs only is more advantageous, since the fact that the transistor is normally off reduces the static power consumption as compared to the DFET design. The drawback lies in the comparably lower speed of the EFET. In many applications, it is, however, desired to utilize both EFETs and DFETs and use the alternating threshold voltage to switch the conductivity between a pair of transistors, as employed in the directly coupled field effect logic (DCFL) circuits. These circuits have demonstrated record low-power and high-speed operation. The limitations in the planar technology are related to the mentioned difficulties in making EFETs with low access resistance, the difficulty to control the threshold voltage in the post-growth process, the presence of short-channel effects as the planar gate length is reduced, and the lack of suitable substrate and lattice-matched heterostructure material for the narrow band gap technologies.

SUMMARY OF THE INVENTION

Obviously the prior art methods have drawbacks with regards to being able to fabricate EFETs and combinations of EFETs and DFETs in small dimensions.

The object of the present invention is to provide a device comprising nanoscaled EFETs and/or combinations of EFETs and DFETs and a method of producing such devices. This is achieved by the device as defined in claim 1 and the methods as defined in claim 20.

The nanowire technology according to the present invention allows for flexibility in the design and the fabrication of the transistors on the same chip. Nanowires with different diameters may be grown in the same growth run utilizing different sizes of the metal catalysts. This allows for a integration of transistors with different threshold voltages. Yet a further advantage is the possibility to tailor the bandstructure along the transport channel using segments of different band gap and or doping levels. This allows for a reduction in both the source-to-gate and gate-to-drain access resistance. These segments may be incorporated directly during the growth, which is not possible in the planar technologies. In particular, this may improve the critical high-frequency performance of the EFETs.

This invention describes various ways to control the threshold voltage in wrap-gated nanowire transistors via nanowire design. The threshold voltage may be controlled by the diameter of the nanowire, the doping level in the nanowire, the introduction of heterostructure segments in the nanowire, the addition of doped layers surrounding the nanowire, tailoring of the workfunction in the gate stack, or by strain-engineering of the channel. The present invention facilitates the possibility to combine transistors with different threshold voltages and in particular the combination of enhancement- and depletion-mode transistors.

As the physical origin of the threshold voltage arises from solutions to the Poisson equation, it is essential to consider the permittivity of the material. In particular, we consider here devices based with a permittivity>1 throughout the device, i.e. we consider devices that are geometrically filled with semiconductor material.

In the semiconductor device according to the present invention at least two vertical nanowire wrap insulating gate field effect transistors (WIGFETs) with different threshold voltage are used to adjust the gate width and the current level of the device by the proper choice of their properties, obtained as described above, and by the number of nanowires used. Vertical nanowire WIGFETs with same properties are arranged in a set, typically a matrix ranging from 1×1 to 15×15. Sets with different threshold voltages are then coupled to form the semiconductor device. The gate width and the current level of the semiconductor device is adjusted by the specific sets used in the device and the number of nanowires used in each set.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF DRAWINGS

Preferred embodiments of the invention will now be described with reference to the accompanying drawings, wherein.

DETAILED DESCRIPTION

Figure 1:
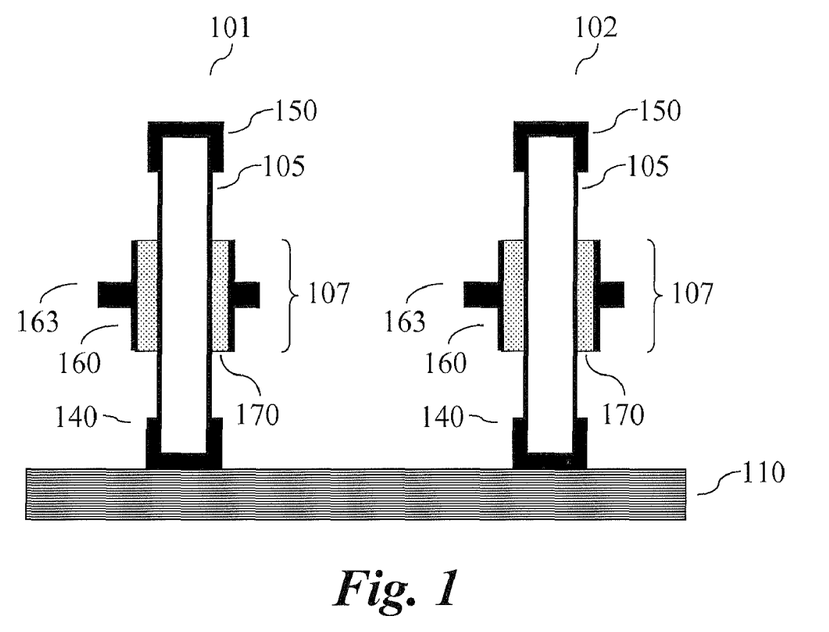
FIG. 1 illustrates schematically a semiconductor device according to the invention.

A semiconductor device according to the invention is schematically illustrated in FIG. 1. The device comprises an assembly of at least two wrap gate field effect transistors (WIGFET) 101, 102. Each of the transistors comprises a nanowire 105 typically of a III/V semiconductor, as a channel. The nanowires 105 are massive as compared to nanotubes, which are hollow cylinders. Although massive, the nanowires may comprise on more segments of different material compositions. The nanowires 105 has been grown on a substrate 110. In one end of the nanowires source contacts 140 are provided and in the opposite end drain contacts 150. Between the source contacts 140 and drain contacts 150 are gate contacts 160 arranged. The gate contacts 160 surrounds, or wraps, the respective nanowire 105, and covers a portion, the gate portion 107 of the respective nanowire. The substrate 110 may form the source contact 140. Alternatively, a dedicated source contact 140 in the form of a patterned layer is provided on the substrate surface. Between the gate contact 160 and the nanowire 105 is a dielectric layer 170. The dielectric layer may be confined to the gate portion 107, or cover a larger portion of the nanowire 105. The gate contact 160, the part of the dielectric layer 170 enclosed by the gate contact and possible other layers or enclosures between the gate contact 160 and the nanowire 105 will be referred to as the gate stack 163.

The nanowires have diameters in the range of 5-200 nm and lengths, or heights, up to the order of μm. The dielectric layer is typically 1-20 nm thick.

The semiconductor device according to the invention comprising nanowire wrap insulating gate field effect transistors (WIGFET) opens new possibilities for the implementation of FETs. While the threshold voltage control in conventional III/V FET technologies relies on the accurate control of the thickness of two-dimensional epitaxial layers that covers the complete wafers, and where the threshold voltage is controlled in separate processing runs, the nanowire technology allows for flexibility in the design and the fabrication of the transistors on the same chip.

This flexibility is utilized in making of the semiconductor design according to the invention comprising the at least two nanowires 105 which are arranged to have different threshold voltages. Typically and preferably, the semiconductor device comprises a first set of nanowire based FETs with a first threshold voltage associated with enhancement mode operations of the FETs and a second set of nanowire based FETs with a second threshold voltage associated with depletion mode operations of the FET. In the following the term E-WIGFET will be used for an enhancement mode wrap gate field effect transistor, and the term D-WIGFET for a depletion mode wrap gate field effect transistor.

Figure 2:
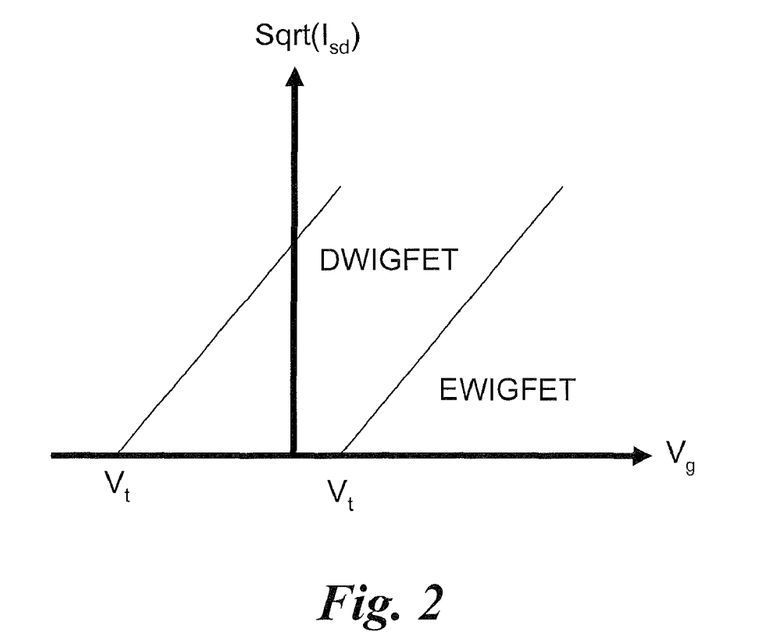
FIG. 2 is a graph that illustrates how the threshold voltage is used to characterize depletion and enhancement type of WIGFETs.

How the threshold voltage can be used to distinguish between an E-WIGFET and an D-WIGFET is illustrated in the graph of FIG. 2, wherein the left line relates to an D-WIGFET and the right to an E-WIGFET. As seen in the figure a negative threshold voltage, $V_t$, is associated with a D-WIGFET, and a positive, $V_t$, with an E_WIGFET. Graphs like FIG. 2 are suitable for long-channel transfer characteristics that distinguishes DFETs from EFETs via the sign of $V_t$. For short-channel devices, $I_{sd}$ is often plotted instead of sqrt $(I_{sd})$.

For example, nanowires with different diameters may be grown in the same growth run utilizing different sizes of catalytic particles that are used to initiate the growth process. Methods of growing nanowires of different and controlled diameters are described in US 2003/010244. This allows for a integration of transistors with different threshold voltages, which for example enables the design of advanced circuits utilizing the shifts in the threshold voltages, like in the directly coupled field logic. The invention is not limited to nanoscaled WIGFETs; the performance of any device based on a nanowire, wherein a threshold voltage is of importance, may be tailored by the herein described means. Other implementations of the nanowire technology according to this invention include, but are not limited to LEDs and sensors. The invented device affords the possibility to tailor the bandstructure along the transport channel using segments of different band gap and or doping levels. This allows for a reduction in both the source-to-gate and gate-to-drain access resistance. These segments may be incorporated directly during the growth, which is not possible in the planar technologies. In particular, this may improve the critical high-frequency performance of the EFETs.

Given the above mentioned desire to achieve complementary function devices, and the benefits of the nanowire technology, we now consider how this may be implemented using WIGFETs.

As the physical origin of the threshold voltage arises from solutions to the Poisson equation, it is essential to consider the permittivity of the material. In particular, nanowire with a permittivity>1 throughout the nanowire are considered, i.e. nanowires that are geometrically filled with semiconductor material. It should be noted that although nanowires are used as an example also other nanostructures could be utilized, given that the permittivity requirement is fulfilled. In the following the term nanowire should be considered as encompassing also other nanostructures with these characteristics.

Figure 3:
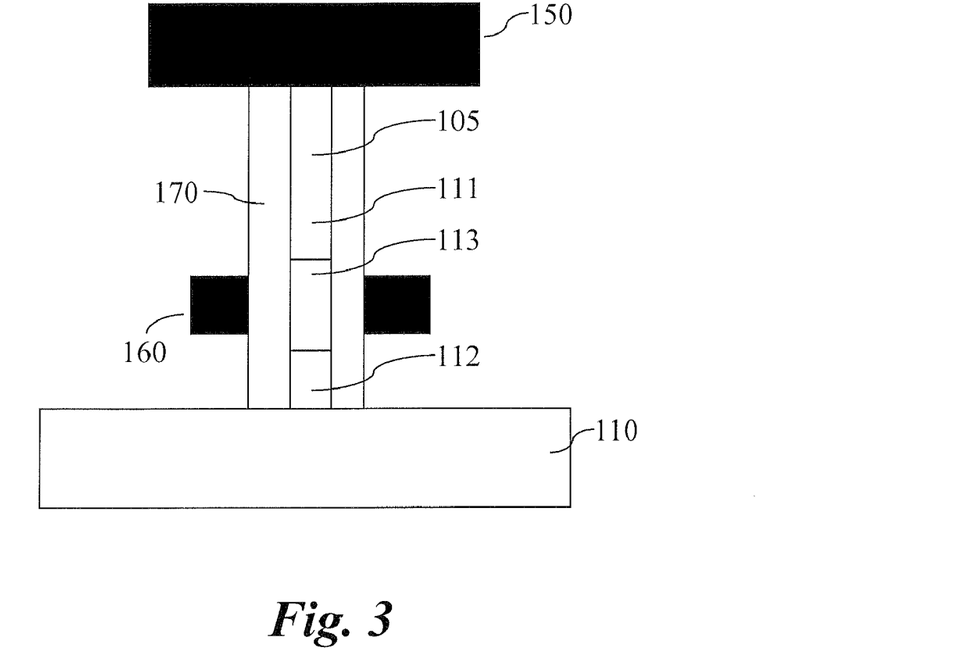
FIG. 3 illustrates schematically an E-WIGFET which may be used in the semiconductor device according to the invention.

N-type and p-type WIGFETs may be fabricated using n- and p-type nanowires that may be of the same or of different semiconductor material. N-type devices are usually considered due to the substantially higher mobility for the electrons than for the holes in a typical III/V material. In FIG. 3 an n-type E-WIGFET device is exemplified, comprising a nanowire 105 of InAs, where the doping and diameter are designed so that the channel is closed at zero gate bias. The nanowire comprises segments of different doping, a lower n+ segment 111, an upper n+ segment 113 and an intermediate n-segment 112. In this non-limiting example the dielectric layer 170 covers a larger portion of the nanowire than just the gate portion. The same design applies to other materials than InAs, for example GaAs, InAs, Ge, ZnO, InN, GaInN, GaN AlGaInN, BN, InP, InAsP, GaInP, InGaP:Si, InGaP:Zn, GaInAs, AlInP, GaAlInP, GaAlInAsP, GaInSb, InSb and Si. A D-WIGFET can be obtained by increasing the doping levels in such a way that the channel remains open at zero gate bias. However, e.g. Ge has a comparable mobility for electrons and holes, as indicated in Table 1, and is therefore of interest. The n- and p-type nanowires may be incorporated as segments into the same nanowire, whereas post-growth processing is used to form the individual transistors on the same nanowire. Alternatively, the nanowires may be grown in different growth runs and be placed besides each other on the substrate. In this case the transistors may be processed during the same processing steps.

In the semiconductor device of the present invention at least two vertical nanowire wrap insulating gate field effect transistors (WIGFETs) with different threshold voltage are used to adjust the gate width and the current level of the device by the proper choice of their properties, obtained by the arrangements described below, and by the number of nanowires used. Vertical nanowire WIGFETs with same properties are arranged in a set, typically a matrix ranging from 1×1 to 15×15. At least two sets are used and the sets are individually addressable.

For the realization of the EWIGFET and DWIGFET, as illustrated in FIG. 3, different alternatives to control the threshold voltage include:

1. Change the Diameter of the Nanowire

The threshold voltage is determined by the amount of charge that needs to be removed to deplete the complete channel. By designing the diameter, conditions will be found where the transistor operates as a EWIGFET or a DWIGFET, respectively, as shown in FIG. 2. Methods are known in the nanowire technology to control the nanowire diameter by the diameter of the catalytic particle. By designing sets of particles with different diameters, nanowires with varying diameters may be grown on a wafer during the same growth run. Alternatively a mask with apertures of different pre-determined sizes can be provided on the substrate and the diameter of nanowires grown out of the apertures will depend on the size of the apertures.

Figure 4:
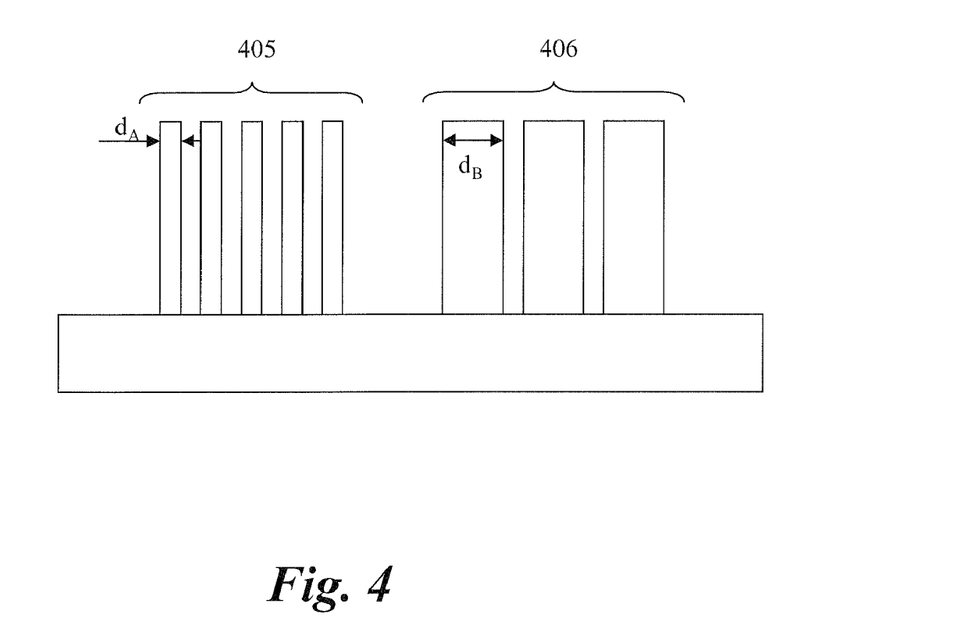
FIG. 4 illustrates schematically one embodiment of the present invention.

According to one embodiment of the semiconductor device according to the invention, schematically illustrated in FIG. 4, one set 405 of nanowires have a diameter, $d_A$, and another set 406 of nanowires have a diameter, $d_B$, that is larger than $d_A$. The smaller diameter, $d_A$, gives the enhancement mode, E-WIGFET, and the larger diameter, $d_B$, the depletion mode, D-WIGFET. The diameter, $d_A$, of the E-WIGFET's nanowires may be down to 5 nm, and the diameter, $d_B$, of the D-WIGFETS may be up to 100 nm. Both nanowire sets have preferably been grown simultaneously on one chip utilizing for example two different sizes of the metal catalysts or different sizes of apertures in a growth mask. In the semiconductor device the two sets in combination and the number of nanowires that are comprised in each set, are used to control the gate width and the current level.

Figure 5:
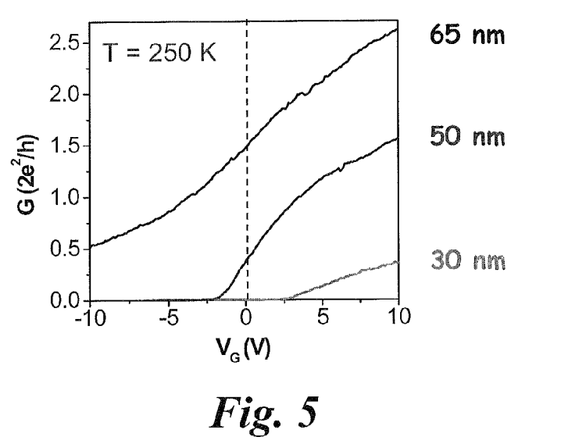
FIG. 5 is a graph illustrating the change of conductance in nanowire as the diameter is changed displaying a shift in the threshold voltage as the diameter is changed, wherein the measurements are performed in a lateral geometry using a back-gate with wires placed on a substrate.
Figure 6:
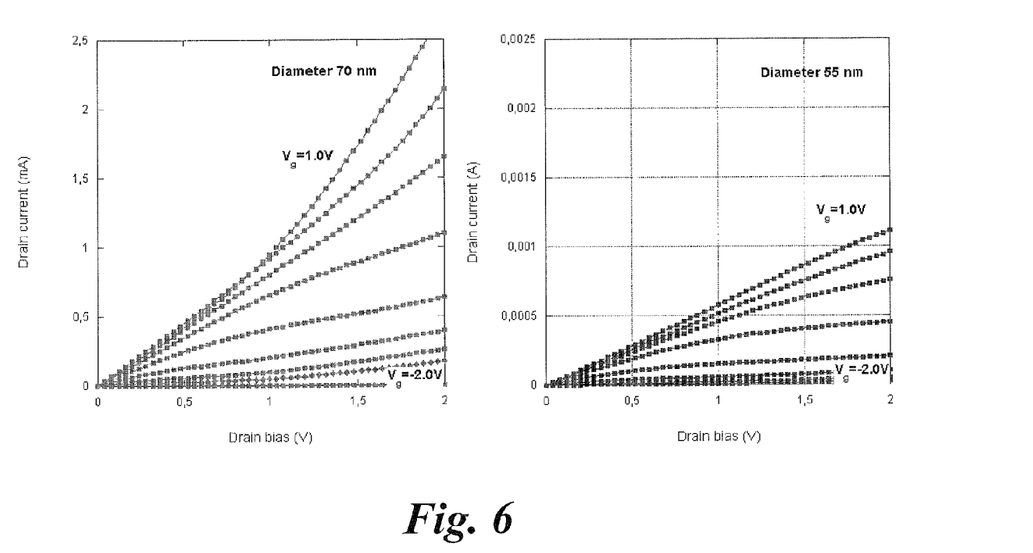
FIG. 6 are graphs illustrating experimental room temperature data for WIGFETs of varying diameter, 70 nm (left) and 55 nm (right), wherein the transistors are processed in the same run, and the gate length is 80 nm (nominal) in both cases and it is processed with an evaporation technique.
Figure 7:
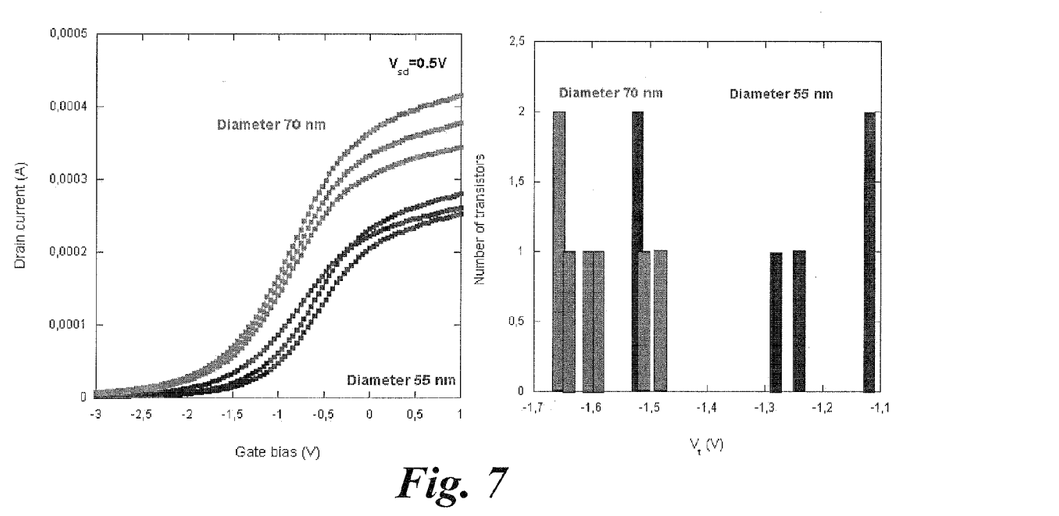
FIG. 7 are graphs illustrating a comparison of transfer characteristics (left) and values of deduced threshold voltages (right) for the transistors in FIG. 6.

FIGS. 5-7 illustrates measurement data that verifies that E-WIGFETs and D-WIGFETs can be provided by using different nanowire diameters. Illustrated in FIG. 5 is the change of conductance in the nanowires as the diameter is changed displaying a shift in the threshold voltage as the diameter is changed, 65 nm, 50 nm and 30 nm, top to bottom. FIG. 6 illustrates experimental room temperature data for WIGFETs of varying diameter, 70 nm (left) and 55 nm (right). The transistors are processed in the same run. The gate length is 80 nm (nominal) in both cases and it is processed with the evaporation technique. FIG. 7 presents a comparison of transfer characteristics (left) and values of deduced threshold voltages (right) for the transistors in FIG. 6. The linear plot is used due to the short-channel behavior of the transistors. Note the shift in threshold voltage as the diameter is reduced.

2. Control of Doping in Channel of the Nanowire Transistor

The threshold voltage is determined by the amount of charge that needs to be removed to deplete the complete channel. By designing the doping in the channel of the nanowire transistor, conditions will be found where the transistor operates as a EWIGFET or a DWIGFET, respectively. To reduce the parasitic access resistance on the source-to-gate side and gate-to-drain side, the nanowire has in those areas preferably a higher doping than in the channel. The variation of the doping level may be achieved by the introduction of dopants from external gas sources during the growth, like Si from Silane or Sulphur from $H_2S$. The background carrier concentration also acts as a doping and it may be controlled by the growth temperature and the V/III-ratio in the gas phase. Alternatively, the source material may be altered, like between TMI and TEI for In-containing materials and TMG and TEG for Ga-containing material. Due to differences in the binding strengths between the atoms in the metalorganics, this is known to produce different incorporations in Chemical Beam Epitaxy (CBE) and Metalorganic Vapour Phase Epitaxy (MOVPE), and Metalorganic Chemical Vapour Deposition (MOCVD).

According to one embodiment the semiconductor device comprises one set of WIGFETs with nanowires with a specific doping level, and another set comprises nanowires with a different doping level, whereby the sets have different threshold voltages. The sets are used in combination in the device to achieve the effect that the combination of two transistors with different threshold voltages gives. The doping levels are typically and preferably in the range $10^{16}$ $cm^{-3}$ to $10^{18}$ $cm^{-3}$, and wherein the E-WIGFETs have a lower doping level than the D-WIGFETs.

3. Change of Work Function in the Gate Stack

The alignment between the Fermi-levels in the gate stack 162 and the semiconductor nanowire determines the extension of the zero gate bias depletion region in the nanowire. A metal with a large work function, like Au, will have longer depletion region, hence give an E-WIGFET, than a metal with a lower work function, like Al or $CrSi_2$ giving an D-WIGFET. Alternatively, the work function may be set by the doping level in a heavily doped poly layer. By adjusting the work function of the gate stack, for instance via the choice of metal or by the doping level in a deposited layer, the threshold voltage may be adjusted.

According to one embodiment the semiconductor device comprises one set of WIGFETs with nanowires with a gate stack 163 with one work function, and another set comprises nanowires with a gate stack 163 with another work function, whereby the sets have different threshold voltages. The set with the largest work function will form the E-WIGFETs, and the lower workfunction will give D-WIGFETs. The sets are used in combination in the device to achieve the effect that the combination of two transistors with different threshold voltages gives.

4. Addition of a Heterostructure Barrier in the Channel of the Transistor

Figure 8:
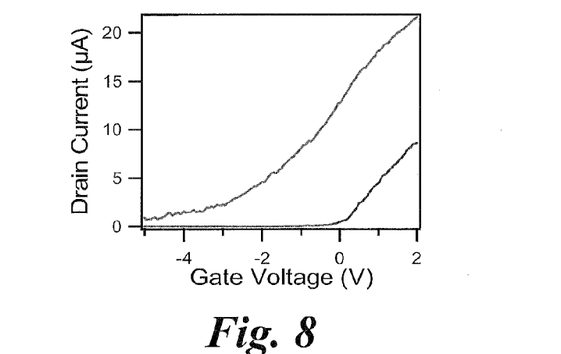
FIG. 8 is a graph illustrating experimental data showing how the introduction of a heterobarrier segment changes the threshold voltage in a planar back-gated InAs/InAsP FET, wherein the left curve is a homogeneous InAs FET and the right curve a heterostructure InAs/InAsP FET.

The band gap of the semiconductor determines the intrinsic carrier concentration. For narrow band gap materials, like InAs and InSb, this carrier concentration may be substantial. By incorporation of a heterostructure barrier in the channel of the transistor, the carrier concentration will be reduced and the threshold voltage will be shifted to more positive biases for a n-type device. The effect is illustrated in FIG. 8 showing experimental data how the introduction of a heterostructure in the form of heterobarrier segment changes the threshold voltage in a planar back-gated InAs/InAsP FET. The left curve is a homogeneous InAs FET and the right curve a heterostructure InAs/InAsP FET. Transistors with or without the heterobarrier will have different threshold voltages, and their combination may be used to achieve the complimentary function. Methods of providing epitaxially grown nanowires with heterostructures are to be found in US 2004/0075464.

Figure 9:
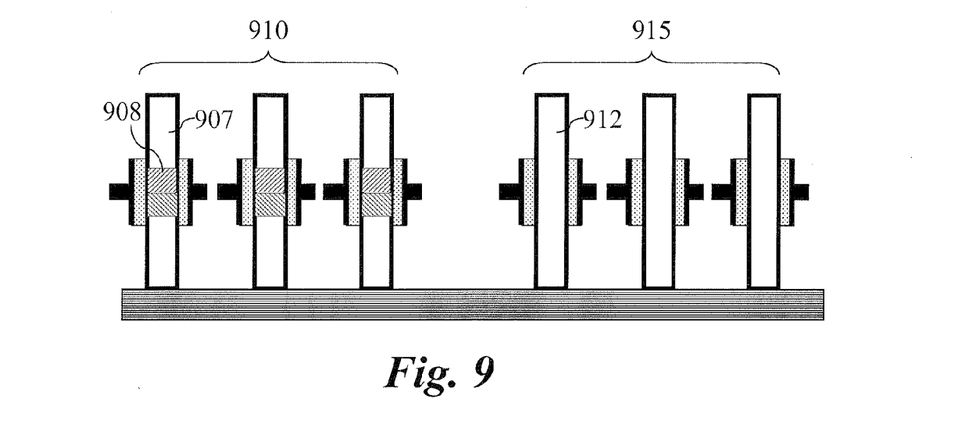
FIG. 9 schematically illustrates one embodiment of the invention using different heterostructures in different sets of transistors.

According to one embodiment the semiconductor device comprises one set of WIGFETs with nanowires that comprises a first heterostructure, and another set comprises nanowires with a different second heterostructure, or alternatively without a heterostructure. The heterostructure is placed in the gate portion of each nanowire. The sets whereby have different threshold voltages. A heterostructure forming a large barrier will enhance E-WIGFET properties and a smaller barrier the D-WIGFET properties. Hence, the E-WIGFETs of the device will have a heterostructure forming a larger barrier than the D-WIGFETs of the device. The sets are used in combination in the device to achieve the effect that the combination of two transistors with different threshold voltages gives. FIG. 9 illustrates as a non-limiting example, a semiconductor device according to the invention, wherein a first set 910 of WIGFETS are provided with nanowires 907 comprising heterostructures 908 and forming E-WIGFETs. D-WIGFETs are provided in a second set 915 formed with nanowires 912 without heterostructures.

5. Addition of Doping in a Shell Layer

Figure 10:
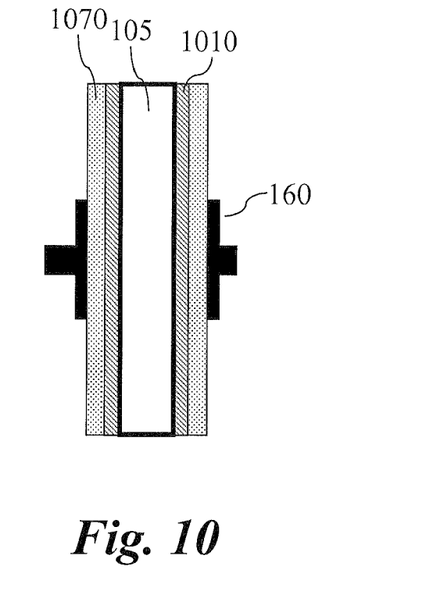
FIG. 10 schematically illustrates one embodiment of the invention using a core-shell structure.

The threshold voltage may be adjusted by the addition of doping (n- or p-type) in a shell layer 1010 surrounding the nanowire 105 forming the core of the nanowire channel, as schematically illustrated in FIG. 10. A dielectric layer 1070 may be provided outside the shell layer 1010 and adjacent to the gate contact. For clarity parts not relevant for this embodiment such as the drain and source contact have been omitted from the figure. This additional doping may add or compensate the charges in the transistor channel and will thus affect the threshold voltage of the transistor.

The threshold voltage may be adjusted by the addition of doping (n- or p-type) in a shell layer surrounding the core of the nanowire channel. The amount of carriers is determined by the thickness and the doping level in the shell layer 110. The thickness of the shell layer is typically in the order of 2-20 nm, and the doping level in the order of $10^{16}$-$10^{18}$ cm$^{-3}$. This additional doping may add or compensate the charges in the transistor channel and will thus affect the threshold voltage of the transistor. The shell may also affect the band alignment between the gate and the transistor channel, via the conduction band discontinuity $\Delta E_c$. Changes in the shell material composition will have a different influence on the gate and channel side and this difference will add to the threshold voltage. The design of the material in the shell layer may thus influence the threshold voltage and by combining wrap-gate transistors with different shells, the complimentary function may be achieved.

According to one embodiment the semiconductor device comprises one set of WIGFETs comprising nanowires that includes a first core/shell heterostructure and another set which comprises a different core/shell heterostructure, whereby the sets have different threshold voltages. The sets are used in combination in the device to achieve the effect that the combination of two transistors with different threshold voltages gives.

6. Strain-engineering of the Channel

The nanowire technology allows the growth of strongly lattice mis-matched materials, where radial strain relaxation is used to accommodate the strain. Addition of tensile strain to a narrow band gap nanowire will increase the band gap of the nanowire and change the band structure. For instance, the addition of a GaAs or InP core/shell to InAs, will affect the position of the conduction band in the semiconductor and consequently the alignment to the Fermi level of the gate electrode may be altered and the threshold voltage of the transistor will be shifted.

According to one embodiment of the device, one set of transistors comprises nanowires that has a build in strain in the channel for instance by the growth of a strained core/shell heterostructure, and another set comprises nanowires with a different strain in the channel for instance by the growth of a different strained core/shell heterostructure, whereby the sets have different threshold voltages. Alternatively only one of the sets comprises a strained core-shell structure. The sets are used in combination in the device to achieve the effect that the combination of two transistors with different threshold voltages gives.

7. Control of the Dielectric Layer in the Gate Stack

At the threshold voltage, the potential drop between the gate and the channel is divided by the drop across the gate dielectric layer and the drop across the depleted nanowire semiconductor material. The potential drop across the dielectric is determined by the thickness of the layer and the permittivity of the material. By changing the thickness and the permittivity on different wires the threshold voltage may be adjusted.

According to one embodiment of the device, one set of transistors comprises nanowires provided with a dielectric layer 170 in the gate region 107 with one thickness and permittivity, and another set comprises nanowires with a dielectric layer 170 in the gate region 107 with a different thickness and/or permittivity, whereby the sets have different threshold voltages. The E-WIGFETs have a thinner dielectric layer, or a dielectric layer with higher permittivity than the D-WIGFETs. The sets are used in combination in the device to achieve the effect that the combination of two transistors with different threshold voltages gives.

8. Change of the Nanowire Material

As the nanowire technology allows the growth of nanowires on different substrates, one may also grow nanowires of different materials on the same substrate. The threshold voltage is related to the position of the Fermi level, $E_f$, in the nanowire related to the surface potential of the nanowire. Different materials have different surface potentials, i.e. the Fermi level is pinned at different positions within the band structure. For instance, GaAs, InP and Si have a mid-gap pinning while GaSb has a pinning close to the valence band and InAs close to the conduction band. The use of nanowires with different materials allows the formation of a device with different threshold voltages.

According to one embodiment the semiconductor device device, one set of transistors comprises nanowires with one material, and another set comprises nanowires with another material, whereby the sets have different threshold voltages. The nanowires of the transistors forming E-WIGFETs are made of a material with a larger bandgap than the material of the nanowires of the D-WIGFETs. The sets are used in combination in the device to achieve the effect that the combination of two transistors with different threshold voltages gives.

The above embodiments have for the reasons of clarity only, been described as only one parameter, for example the diameter, being varied between the sets of nanowires to accomplish the different threshold voltages, i.e. the enhancement or depletion characteristics of the individual transistors. As appreciated by the skilled in the art the above embodiments can be combined to further tailor the design of the semiconductor device. For example may different diameters by used in combination with core shells of different doping to enhance the individual effects. Either of the ways described above (1-8), or combinations thereof, can be used to alter the threshold level and the there is in principle no limitation in the number of sets that are integrated in the device. Given the teachings above, such combinations are possible to conceive and carry out for the skilled person using methods known in the art.

Figure 11:
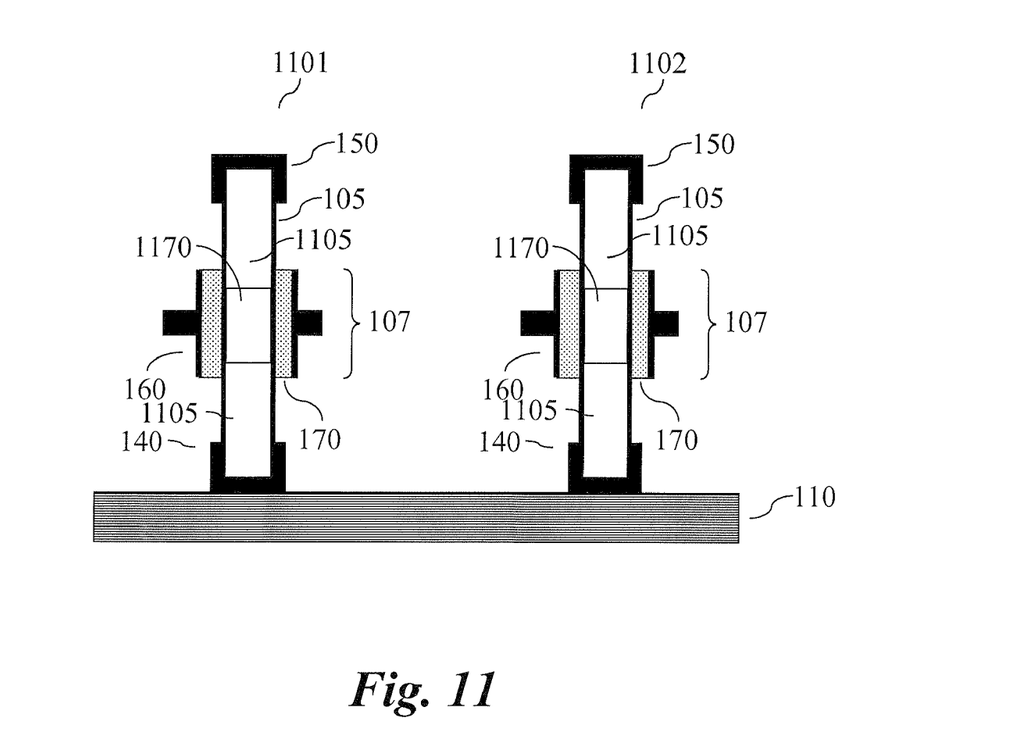
FIG. 11 schematically illustrates one embodiment of the invention comprising n- and p-doped transistors.

An exemplary realization of the device one embodiment is schematically illustrated in FIG. 11 and comprises two sets of nanowires, where the nanowire WIGFETs in one set are of n-type 1101 and the nanowire WIGFETs in the other set are of p-type 1102, and where the above mentioned methods, for instance the diameter or the doping level, are used to adjust the threshold voltages of the devices. The nanowires 105 may be formed with three segments as illustrated, where leads 1105 and channel 1170 are compromised by different semiconductor materials, corresponding to the lower n+ segment 111, the upper n+ segment 113 and the intermediate n-segment 112 of FIG. 3. For a n-type FET, the lead/channel heterojunction is of type I or II, with the channel material having a positive conduction band offset to the lead material. The leads are of n-type doping, and the channel is of p-type doping. The channel material is chosen such that the p-type doping can be more effectively incorporated than in the leads, such as using InAsP for the channel and InAs for the leads. The combination of heterojunction and doping allows for usage of a lower doping level and a smaller conduction band offset to achieve a certain threshold voltage shift compared with doping or heterojunction alone. P-type FETs can be constructed in a similar fashion, with reversed doping polarities, and a lead/channel heterojunction offset with a negative valence band offsets.

According to yet another embodiment of the device that comprise of different sets of nanowires, where all sets have different threshold voltages achieved with the methods mentioned. At least one set has a threshold voltage that makes it a depletion mode transistor (DWIGFET), whereas at least another set act as a enhancement mode transistor (EWIGFET), with a difference in threshold voltage achieved by inserting a heterostructure in one of the sets. Given both types (enhancement type and depletion type) of transistors, these may be combined into complex circuits, for instance in directly-coupled field logic circuits.

A basic device well suited to comprise EWIGFETs and DWIGFETs according to the invention is the inverter schematically illustrated in FIG. 12 comprising one E-WIGFET and one D-WIGFET. The E-WIGFET and the D-WIGFET may be provided individually on the substrate or alternatively after each other in the same nanowire.

Suitable materials for the substrate of the device include, but is not limited to: Si, GaAs, GaP, GaP:Zn, GaAs, InAs, InP, GaN, $Al_2O_3$, SiC, Ge, GaSb, ZnO, InSb, SOI (silicon-on-insulator), CdS, ZnSe, CdTe. Suitable materials for the nanowires include, but is not limited to IV, III-V, II-VI semiconductors such as: GaAs (p), InAs, Ge, ZnO, InN, GaInN, GaN AlGaInN, BN, InP, InAsP, GaInP, InGaP:Si, InGaP:Zn, GaInAs, AlInP, GaAlInP, GaAlInAsP, GaInSb, InSb and Si. It should be noted that the method and device according to the present invention is well suited for production of devices based on nitrides such as GaN, InN and AlN characterized by a high bandgap and suitable for high voltage and/or high power applications. Other combinations of commercial interest include, but is not limited to GaAs, GaInP, GaAlInP, GaP systems. Possible donor dopants are, but not limited to, Si, Sn, Te, Se, S, etc, and acceptor dopants are Zn, Fe, Mg, Be, Cd, etc.

The method of fabricating the semiconductor device comprising nanowires of different diameters according to one embodiment of the invention comprises the steps of:
a) providing a size definition of a first size in at least one first confined area of a substrate, either by depositing catalytic particles of a first size in the confined area of a substrate, or by providing a growth mask with apertures of pre-determined first diameter and positions in the confined area of a substrate;
b) providing a size definition of a second size in at least one second confined area of a substrate, either by depositing catalytic particles of a second size in the confined area of a substrate, or by providing a growth mask with apertures of pre-determined second diameter and positions in the confined area of a substrate;
c) growing simultaneously nanowires from both first and second catalytic particle sizes, or from apertures of first and second diameter, thereby forming a first set of nanowires with a first diameter and a second set of nanowires with a second diameter, relating respectively to a first and second threshold value; and
d) contacting the first and second set of nanowires so that the sets are individually addressable.

The method of fabricating the semiconductor device comprising nanowires exhibiting different characteristics according to one embodiment of the invention comprises the steps of:
a) growing in a first growth run nanowires with first characteristics at at least one first confined area of a substrate, forming a first set of nanowires;
b) growing in a second growth run nanowires with second characteristics at at least one second confined area of a substrate, forming a second set of nanowires; and c) contacting the first and second set of nanowires so that the sets are individually addressable.

The growth of the nanowires may comprise selective epitaxy where particles are used to assist the anisotropic growth. Chemical Beam Epitaxy or different types of Vapour Phase Epitaxy methods may be employed for the growth. Lithographic methods or metal particle deposition are used to define the metal particles and the size of the metal particle determines the diameter of the wires. Typically, diameters below 200 nm, with a standard deviation of 5%, can be fabricated. Wires only grow at the defined locations and the planar growth rate is negligible in this particle assisted growth mode. Suitable methods for growing nanowires on semiconductor substrates are described in US 2003/010244. Methods of providing epitaxially grown nanowires with heterostructures are to be found in US 2004/0075464. As an alternative selective area epitaxy (SAE) can be used to grow nanowires.

The invention has mainly been described above with reference to a few embodiments. However, as is readily appreciated by a person skilled in the art, other embodiments than the ones disclosed above are equally possible within the scope of the invention, as defined by the appended patent claims.

TABLE 1

|  | Electron mobility (cm$^2$/Vs) | Hole mobility (cm$^2$/Vs) |
| --- | --- | --- |
| Si | 1500 | 450 |
| Ge | 3900 | 1900 |
| GaAs | 8500 | 400 |
| InP | 4600 | 150 |
| InAs | 33000 | 460 |
| InSb | 80000 | 1250 |

Room temperature mobility for various semiconductor materials without strain

The invention claimed is:

1. A semiconductor device comprising at least two vertical nanowire wrap insulating gate field effect transistors, wherein:
   each of the transistors comprises a massive nanowire, which comprises a channel of the transistor;
   the nanowire transistors are grouped into at least a first and a second individually addressable set;
   each of the transistors comprises a gate stack comprising a gate contact enclosing a portion of the nanowire and a dielectric layer between the gate contact and the nanowire;
   each of the transistors of the first set comprises a first gate stack having a first dielectric layer and exhibiting a first work function, and a nanowire of a first diameter and with a first doping level, giving a first threshold voltage; and
   each of the transistors of the second set comprises a second gate stack having a second dielectric layer and exhibiting a second work function, and a nanowire of a second diameter and with a second doping level, giving a second threshold voltage that differs from the first threshold voltage,
   wherein at least one of the following is satisfied:
   1) the first and the second dielectric layer differ in thickness or in permittivity;
   2) the first work function is different from the second work function;
   3) the first diameter is different from the second diameter; or
   4) the first doping level is different from the second doping level.

2. The semiconductor device according to claim 1, wherein the transistors of the first set are of enhancement type and the transistors of the second set are of depletion type.

3. The semiconductor device according to claim 1, wherein the diameter of the nanowires in the first set is smaller than the diameter of the nanowires in the second set and the diameter of the nanowires in the first set of transistors is below 20 nm.

4. The semiconductor device according to claim 1, wherein the first and second doping level are in the interval $10^{16}$-$10^{18}$ cm$^{-3}$.

5. The semiconductor device according to claim 1, wherein the first gate stack comprises a gate contact of a first metal or metal combination and the second gate stack comprises a gate contact of a second metal or metal combination, and wherein the first metal or metal combination has a larger work function than the second metal or metal combination.

6. The semiconductor device according to claim 1, wherein the first gate stack comprises a doped layer with a first doping level giving the first work function and the second gate stack comprises a doped layer with a second doping level giving the second work function, wherein the second doping level is different from the first doping level.

7. The semiconductor device according to claim 1, wherein the nanowires are at least partly enclosed by a doped shell layer and each transistor of the first set is provided with a first doped shell layer providing a first carrier concentration to the enclosed nanowire giving the first threshold voltage, and each transistor of the second set is provided with a second doped shell layer providing a second carrier concentration to the enclosed nanowire giving the second threshold voltage, wherein the second carrier concentration is different from the first carrier concentration.

8. The semiconductor device according to claim 7, wherein the first and second doped shell layers differ in a thickness.

9. The semiconductor device according to claim 7, wherein the first and second doped shell layers differ in a doping level.

10. The semiconductor device according to claim 1, wherein the transistors with the first threshold voltage and the transistor with the second threshold voltage are formed in the same nanowire.

11. The semiconductor device according to claim 1, wherein the transistors comprise both n-type and p-type transistors.

12. The semiconductor device according to claim 1, wherein the first and the second dielectric layer differ in thickness or in permittivity.

13. The semiconductor device according to claim 1, wherein the first work function is different from the second work function.

14. The semiconductor device according to claim 1, wherein the first diameter is different from the second diameter.

15. The semiconductor device according to claim 1, wherein the first doping level is different from the second doping level.

16. The semiconductor device according to claim 1, wherein:
   the first and the second dielectric layer differ in thickness or in permittivity;
   the first work function is different from the second work function;
   the first diameter is different from the second diameter; and
   the first doping level is different from the second doping level.

17. A semiconductor device comprising at least two vertical nanowire wrap insulating gate field effect transistors, wherein each of the transistors comprises a massive nanowire, which comprises a channel of the transistor, and wherein one of the transistors has a first threshold voltage and the other transistor has a second threshold voltage that differs from the first threshold voltage, and the nanowire transistors are grouped into at least a first and a second individually addressable set;

wherein each of the transistors comprises a gate contact enclosing a portion of the nanowire, the enclosed portion defining a gate region, and the first set of transistors comprises nanowires each with a first heterostructure in the gate region giving the first threshold voltage, and the second set of transistor comprises nanowires each with a second heterostructure or no heterostructure in the gate region giving the second threshold voltage.

18. A semiconductor device comprising at least two vertical nanowire wrap insulating gate field effect transistors, wherein each of the transistors comprises a massive nanowire, which comprises a channel of the transistor, and wherein one of the transistors has a first threshold voltage and the other transistor has a second threshold voltage that differs from the first threshold voltage, and the nanowire transistors are grouped into at least a first and a second individually addressable set;

wherein each of the transistors of the first set is arranged according to a structure resulting in a first strain in the nanowire giving the first threshold voltage, and each of the transistors of the second set is arranged according to a structure resulting in a second strain in the nanowire giving the second threshold voltage.

19. The semiconductor device according to claim 18, wherein each of the transistors in the first set has a first core/shell-structure and each of the transistors in the second set has a second core/shell structure, which is different from the first core/shell structure.

20. The A semiconductor device comprising at least two vertical nanowire wrap insulating gate field effect transistors, wherein each of the transistors comprises a massive nanowire, which comprises a channel of the transistor, and wherein one of the transistors has a first threshold voltage and the other transistor has a second threshold voltage that differs from the first threshold voltage, and the nanowire transistors are grouped into at least a first and a second individually addressable set;

wherein the first set of transistors comprises nanowires of a first material and the second set of transistor comprises nanowires of a second material, wherein the first and second materials differ in a bandgap.

\* \* \* \* \*